(12) United States Patent
Cheng (10) Patent No.: US 11,908,686 B2
(45) Date of Patent: Feb. 20, 2024

(54) METHODS OF MANUFACTURING VERTICAL DEVICE

(71) Applicant: Enkris Semiconductor, Inc., Suzhou (CN)

(72) Inventor: Kai Cheng, Suzhou (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 182 days.

(21) Appl. No.: 17/599,668

(22) PCT Filed: Sep. 12, 2019

(86) PCT No.: PCT/CN2019/105710
§ 371 (c)(1),
(2) Date: Sep. 29, 2021

(87) PCT Pub. No.: WO2021/046805
PCT Pub. Date: Mar. 18, 2021

(65) Prior Publication Data
US 2022/0084821 A1    Mar. 17, 2022

(51) Int. Cl.
*H01L 21/321* (2006.01)
*H01L 21/02* (2006.01)
*H01L 29/812* (2006.01)

(52) U.S. Cl.
CPC .... *H01L 21/02389* (2013.01); *H01L 21/0254* (2013.01); *H01L 21/02458* (2013.01); *H01L 21/3212* (2013.01); *H01L 29/8122* (2013.01)

(58) Field of Classification Search
CPC ......... H01L 21/02389; H01L 21/02458; H01L 21/0254; H01L 21/3212; H01L 29/8122;
(Continued)

(56) References Cited

U.S. PATENT DOCUMENTS

| 9,059,199 B2 | 6/2015 | Nie et al. |
| 2014/0191242 A1 | 7/2014 | Nie et al. |

(Continued)

FOREIGN PATENT DOCUMENTS

| CN | 100345306 C | 10/2007 |
| CN | 102254939 A | 11/2011 |

(Continued)

OTHER PUBLICATIONS

ISA State Intellectual Property Office of the People's Republic of China, International Search Report Issued in Application No. PCT/CN2019/105710, dated Jun. 11, 2020, WIPO, 4 pages.

(Continued)

*Primary Examiner* — Elias Ullah
(74) *Attorney, Agent, or Firm* — The Small Patent Law Group LLC; Christopher R. Carroll (57) ABSTRACT

The present application provides methods for manufacturing a vertical device. To begin with, a GaN-based semiconductor substrate is etched from a front surface to form a trench. Then, a P-type semiconductor layer and an N-type semiconductor layer are sequentially formed on a bottom wall and side walls of the trench and the front surface of the semiconductor substrate. The trench is partially filled with the P-type semiconductor layer. Thereafter, the N-type semiconductor layer and the P-type semiconductor layer are planarized, and the P-type semiconductor layer and the N-type semiconductor layer in the trench are retained. Next, a gate structure is formed at a gate area of the front surface of the semiconductor substrate, a source electrode is formed on two sides of the gate structure, and a drain electrode is formed on a rear surface of the semiconductor substrate respectively.

18 Claims, 7 Drawing Sheets

(58) Field of Classification Search
CPC .............. H01L 29/0869; H01L 29/7802; H01L 29/0696; H01L 29/0878; H01L 29/66712; H01L 29/2003
See application file for complete search history.

(56) References Cited

U.S. PATENT DOCUMENTS

| | | | |
|---|---|---|---|
| 2015/0061007 A1* | 3/2015 | Yang .................. | H01L 29/7802 438/269 |
| 2015/0243758 A1 | 8/2015 | Nie et al. | |
| 2016/0254391 A1* | 9/2016 | Kinoshita .......... | H01L 21/0254 257/76 |
| 2020/0116823 A1* | 4/2020 | Balasubramaniyan ..................... | H03B 5/1215 |

FOREIGN PATENT DOCUMENTS

| | | |
|---|---|---|
| CN | 104904019 A | 9/2015 |
| CN | 106952957 A | 7/2017 |
| JP | 2006313859 A | 11/2006 |
| JP | 2010067670 A | 3/2010 |

OTHER PUBLICATIONS

ISA State Intellectual Property Office of the People's Republic of China, Written Opinion of the International Searching Authority Issued in Application No. PCT/CN2019/105710, dated Jun. 11, 2020, 2019, WIPO, 5 pages. (Submitted with Machine Translation).

* cited by examiner

| Provide a GaN-based semiconductor substrate, where the semiconductor substrate has a front surface and a rear surface opposite to each other, and the semiconductor substrate is etched from the front surface to form a trench | ~S1 |

| Sequentially form a P-type semiconductor layer and an N-type semiconductor layer on a bottom wall and side walls of the trench and the front surface of external semiconductor substrate, where the trench is partially filled with the P-type semiconductor layer, and the N-type semiconductor layer at least fully fills the trench | ~S2 |

| Planarize the N-type semiconductor layer and the P-type semiconductor layer, and retain the P-type semiconductor layer and the N-type semiconductor layer in the trench | ~S3 |

| Respectively form a gate structure, a source electrode, and a drain electrode, where the gate structure is located at a gate area of the front surface of the semiconductor substrate, the source electrode is located on two sides of the gate structure, and the drain electrode is located on the rear surface of the semiconductor substrate | ~S4 |

| Provide a GaN-based semiconductor substrate, where the semiconductor substrate has a front surface and a rear surface opposite to each other, and the semiconductor substrate is etched from the front surface to form a trench | — S1 |

| Sequentially form a P-type semiconductor layer and an N-type semiconductor layer on a bottom wall and side walls of the trench and the front surface of the semiconductor substrate, where the P-type semiconductor layer partially fills the trench, and the N-type semiconductor layer partially fills the trench | — S2' |

| Planarize the N-type semiconductor layer and the P-type semiconductor layer, and retain the P-type semiconductor layer and the N-type semiconductor layer in the trench | — S3 |

| Respectively form a gate structure, a source electrode, and a drain electrode, where the gate structure is located at a gate area of the front surface of the semiconductor substrate, the source electrode is located on two sides of the gate structure, and the drain electrode is located on the rear surface of the semiconductor substrate | — S4 |

METHODS OF MANUFACTURING VERTICAL DEVICE

TECHNICAL FIELD

This application relates to the field of semiconductor technologies, and in particular, to methods for manufacturing a vertical device.

BACKGROUND

Group III nitride semiconductor substrates such as gallium nitride have attracted more and more attention, since the group III nitride semiconductor substrates can be widely used as light-emitting diodes (LED) for semiconductor lighting, high power electronics and radio frequency devices.

According to whether a conductive channel is vertical or parallel to a semiconductor substrate, transistors are classified into vertical devices and planar devices. Due to the contribution of semiconductor substrates in thickness, compared with the planar devices, the vertical devices can improve the area utilization of the semiconductor substrate, and characteristics of high voltage resistance, low conduction resistance, and high transconductance can be implemented.

However, the performance of the vertical devices formed by existing manufacturing processes can deviate from pre-designed performance. In other words, the manufacturing processes cause the performance of the vertical devices, especially, a gate structure part, to be less controllable.

In view of this, it is really necessary to provide a new method for manufacturing a vertical device to solve the above-mentioned technical problems.

SUMMARY

An object of the present invention is to provide methods for manufacturing a vertical device to improve performance controllability corresponding to a manufacturing process.

To achieve the object, a method for manufacturing a vertical device provided by the present invention includes:
  providing a GaN-based semiconductor substrate, where the semiconductor substrate has a front surface and a rear surface opposite to the front surface, and the semiconductor substrate is etched from the front surface to form a trench;
  sequentially forming a P-type semiconductor layer and an N-type semiconductor layer on a bottom wall and side walls of the trench and the front surface of the semiconductor substrate, where the trench is partially filled with the P-type semiconductor layer;
  planarizing the N-type semiconductor layer and the P-type semiconductor layer, and retaining the P-type semiconductor layer and the N-type semiconductor layer in the trench; and
  respectively forming a gate structure, a source electrode, and a drain electrode, where the gate structure is located in a gate area of the front surface of the semiconductor substrate, the source electrode is located on two sides of the gate structure, and the drain electrode is located on the rear surface of the semiconductor substrate.

It should be noted that planarization refers to that, after the process is completed, upper surfaces of semiconductor layers inside and outside the trench are flat.

Optionally, in sequentially forming the P-type semiconductor layer and the N-type semiconductor layer on the bottom wall and the side walls of the trench and the front surface of the semiconductor substrate, the N-type semiconductor layer at least fully fills the trench.

Optionally, in sequentially forming the P-type semiconductor layer and the N-type semiconductor layer on the bottom wall and the side walls of the trench and the front surface of the semiconductor substrate, the N-type semiconductor layer partially fills the trench.

Optionally, a number of trenches is N, where N≥2, and a number of gate structures is N−1.

Optionally, the N-type semiconductor layer and/or the P-type semiconductor layer include(s) a GaN-based Material.

Optionally, materials of the semiconductor substrate, and/or the N-type semiconductor layer, and/or the P-type semiconductor layer are same or different.

Optionally, the N-type semiconductor layer and the P-type semiconductor layer are planarized through Chemical Mechanical Polishing.

Optionally, the GaN-based semiconductor substrate is an N-type semiconductor substrate.

Optionally, the semiconductor substrate includes an N-type ion heavily doped layer and an N-type ion lightly doped layer on the N-type ion heavily doped layer, and the trench is formed in the N-type ion lightly doped layer.

Optionally, the gate structure includes a gate insulating layer, and a gate electrode provided on the gate insulating layer.

Compared with the prior art, the present invention has the following beneficial effects:
  1) To begin with, a GaN-based semiconductor substrate is etched from a front surface to form a trench. Then, a P-type semiconductor layer and an N-type semiconductor layer are sequentially formed on a bottom wall and side walls of the trench and the front surface of the semiconductor substrate. The P-type semiconductor layer at least partially fills the trench. Thereafter, the N-type semiconductor layer and the P-type semiconductor layer are planarized, and the P-type semiconductor layer and the N-type semiconductor layer in the trench are retained. Next, a gate structure is formed at a gate area of the front surface of the semiconductor substrate, a source electrode is formed on two sides of the gate structure, and a drain electrode is formed on a rear surface of the semiconductor substrate. Etching the N-type semiconductor layer and the P-type semiconductor layer is avoided to make the gate structure, thereby avoiding that the control capability of the gate structure deviates from a pre-designed control capability due to a difficulty in precise control over an etching depth. In this way, the performance of the vertical device can be precisely controlled through a manufacturing process.
  2) In an alternative, a) in the step that sequentially forming the P-type semiconductor layer and the N-type semiconductor layer on the bottom wall and the side walls of the trench and the front surface of the semiconductor substrate, the N-type semiconductor layer can fully fill the trench; the N-type semiconductor layer and the P-type semiconductor layer are being planarized, which is stopped when the semiconductor substrate is exposed. Or, b) in the step that sequentially forming the P-type semiconductor layer and the N-type semiconductor layer on the bottom wall and the side walls of the trench and the front surface of the semiconductor substrate, the N-type semiconductor layer can partially fill the trench; in the step that planarizing the N-type semiconductor layer and the P-type semiconductor layer, a part of the semiconductor substrate is removed to reduce thickness. Regardless of the alternative a) or the alternative b), an N-type source area and a P-type channel area can be formed. The N-type source area can be in-situ doped with N-type ions, and the P-type channel area can be in-situ doped with P-type ions. Compared with an ion implantation diffusion process, sizes and ion concentrations of the N-type source area and the P-type channel area can be precisely controlled.

3) In an alternative, the number of trenches is two, and the semiconductor substrate between the two trenches allows most of a depletion area formed by the P-type semiconductor layer and the semiconductor substrate to exist in the semiconductor substrate area, which can effectively prevent the occurrence of a punch-through effect between a source electrode and a drain electrode. In addition, compared with a single trench, double trenches increase the number of channels, and can improve current capacity.

4) In an alternative, the number of trenches is N, where N≥3, the number of gate structures is N−1. Each gate structure extends from a P-type semiconductor layer in one trench to a P-type semiconductor layer in an adjacent trench. Compared with the alternative 3), this alternative further increases the number of channels, thereby can further improve current capacity.

5) In an alternative, the gate structure of the vertical device includes a gate insulating layer and a gate electrode stacked from the bottom up, or the gate structure only includes the gate electrode. The solution of the present invention can be used for insulated gate field effect transistors, or for Schottky gate field effect transistors, and has strong compatibility with existing processes.

BRIEF DESCRIPTION OF THE DRAWINGS

FIGS. 2(a) to 6 are schematic diagrams illustrating an intermediate structure corresponding to a process in FIG. 1.

To facilitate the understanding of the present invention, all reference signs appearing in the present invention are listed below:

GaN-based semiconductor substrate 10
Front surface 10a of the semiconductor substrate
Rear surface 10b of the semiconductor substrate
Trenches 101, 101'
P-type semiconductor layer 11
N-type semiconductor layer 12
Gate structure 13
Source electrode 14
Drain electrode 15
Gate insulating layer 131
Gate electrode 132

DETAILED DESCRIPTION OF THE EMBODIMENTS

In order to make the previously described objects, features and advantages of the present invention more obvious and understandable, specific embodiments of the present invention will be described in detail below with reference to the drawings.

Figure 1:
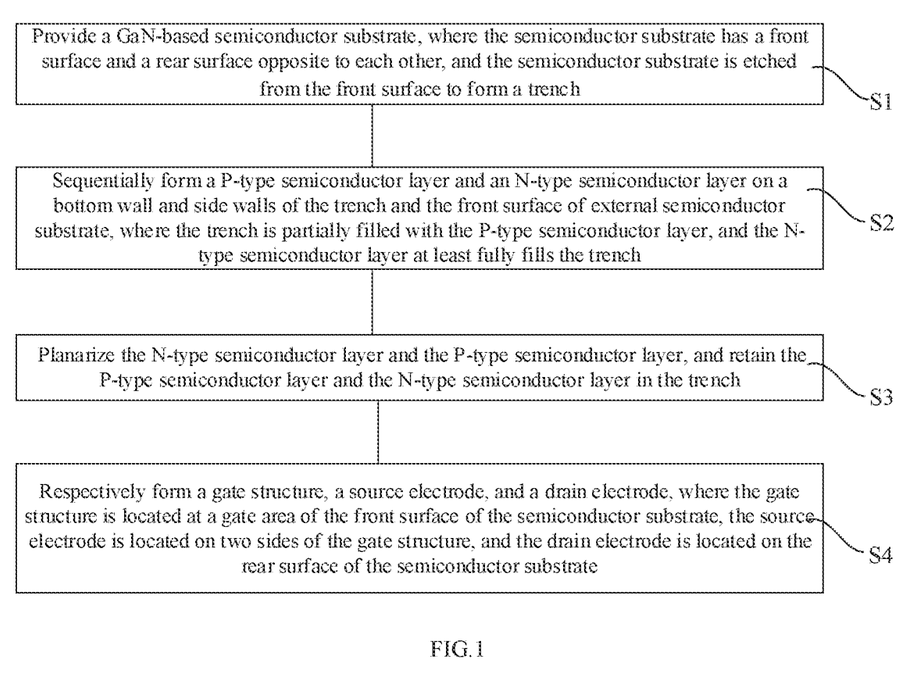
FIG. 1 is a flowchart illustrating a method for manufacturing a vertical device according to a first embodiment of the present invention.

FIG. 1 is a flowchart illustrating a method for manufacturing a vertical device according to a first embodiment of the present invention. FIGS. 2(a) to 6 are schematic diagrams illustrating intermediate structures corresponding to a process in FIG. 1.

Figure 2A:
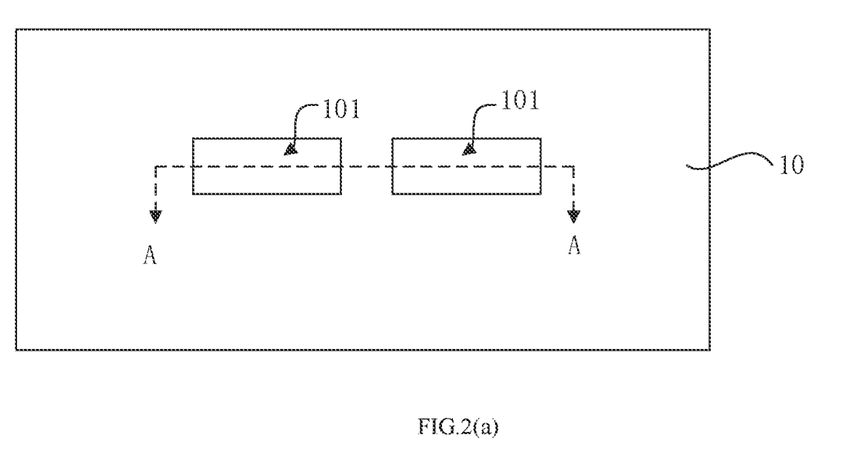
Figure 2B:
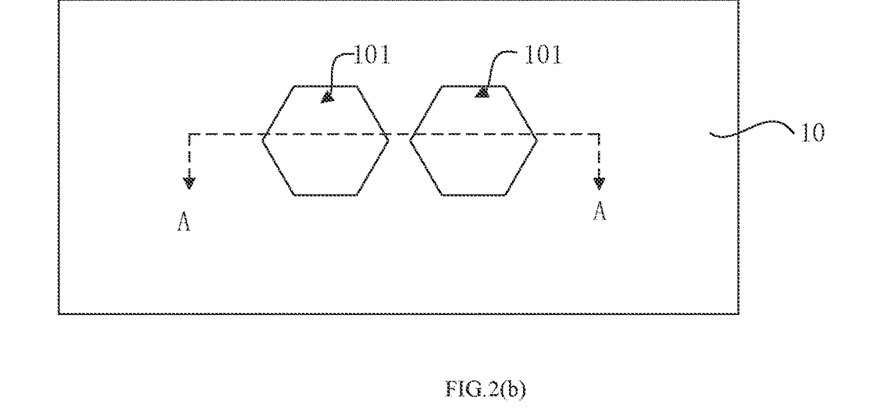
Figure 2C:
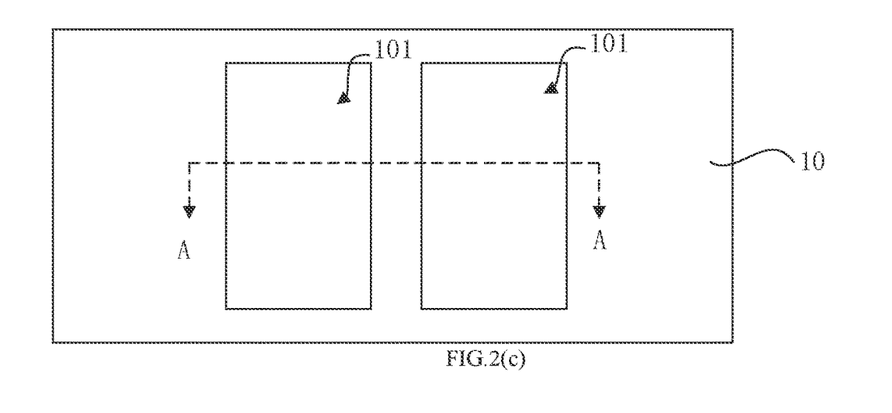
Figure 3:
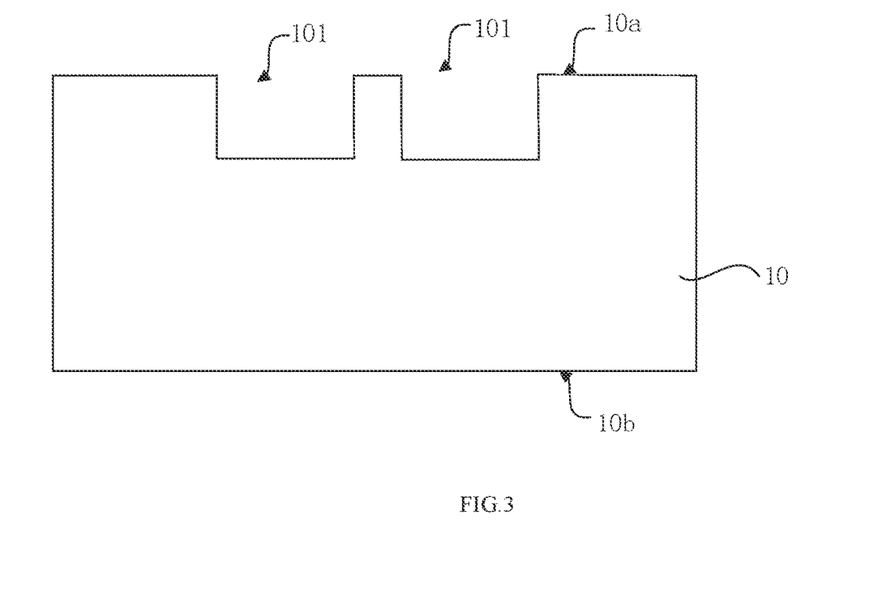

To begin with, at step S1, as shown in FIGS. 2(a) to 3, a GaN-based semiconductor substrate 10 is provided. The semiconductor substrate 10 has a front surface 10a and a rear surface 10b opposite to each other. The semiconductor substrate 10 is etched from the front surface 10a to form a trench 101.

FIG. 3 is a cross-sectional view taken along a line AA in FIGS. 2(a) to 2(c).

The GaN-based semiconductor substrate 10 can include a single-layer structure or a multiple-layer structure. A material of each layer can include GaN, AlGaN, or AlInGaN, or other semiconductor material containing a Ga atom and an N atom, or a mixture of at least two of these materials. The GaN-based semiconductor substrate 10 may be doped with ions to become an N-type semiconductor substrate.

The shape of the trench 101 on a plane where the GaN-based semiconductor substrate 10 is located can be rectangular as shown in FIG. 2(a), or be hexagonal as shown in FIG. 2(b). In other alternatives, the shape of the trench 101 on the plane where the GaN-based semiconductor substrate 10 is located can be circular or other shapes, which is not limited in the present invention.

In addition, the shape of the trench 101 on the plane where the GaN-based semiconductor substrate 10 is located can be strip-shaped as shown in FIG. 2(c).

Referring to FIGS. 2(a) to 3, in this embodiment, the number of the trenches 101 is two. In other embodiments, the number of trenches 101 can be one.

Figure 4:
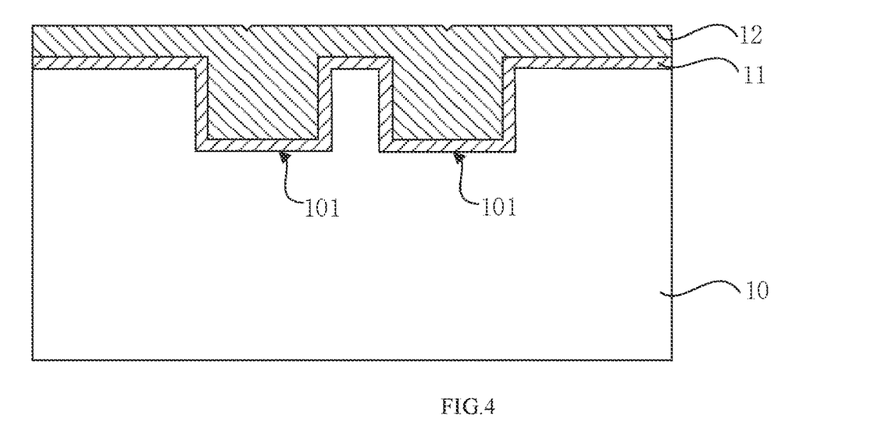

Next, at step S2, as shown in FIG. 4, a P-type semiconductor layer 11 and an N-type semiconductor layer 12 are formed sequentially in the trench 101 and on the front surface 10a of the semiconductor substrate. The trench 101 is partially filled with the P-type semiconductor layer 11, and the N-type semiconductor layer 12 at least fully fills the trench 101.

The situation that the trench 101 is partially filled with the P-type semiconductor layer 11, and the N-type semiconductor layer 12 at least fully fills the trench 101 can be implemented by forming a relative thin P-type semiconductor layer 11 and a relative thick N-type semiconductor layer 12.

As shown in FIG. 4, the N-type semiconductor layer 12 can overfill the trench 101, that is, a sum of thicknesses of the N-type semiconductor layer 12 and the P-type semiconductor layer 11 at the trench 101 is greater than a depth of the trench 101. In other alternatives, the N-type semiconductor layer 12 can exactly fill the trench 101, that is, the sum of thicknesses of the N-type semiconductor layer 12 and the P-type semiconductor layer 11 at the trench 101 is equal to the depth of the trench 101.

Materials of the P-type semiconductor layer 11 and the N-type semiconductor layer 12 can be same or different, and both of them can include a GaN-based material. The GaN-based material is a semiconductor material including at least Ga atom and N atom, and includes, for example, GaN, AlGaN, or AlInGaN. The materials of the P-type semiconductor layer 11 and the N-type semiconductor layer 12 can be the same as or different from that of the semiconductor substrate 10.

Processes for forming the P-type semiconductor layer 11 and the N-type semiconductor layer 12 can include: Atomic Layer Deposition (ALD), or Chemical Vapor Deposition (CVD), or Molecular Beam Epitaxy (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

Doping ions in the P-type semiconductor layer 11 and the N-type semiconductor layer 12 can be implemented by in-situ doping.

Figure 5:
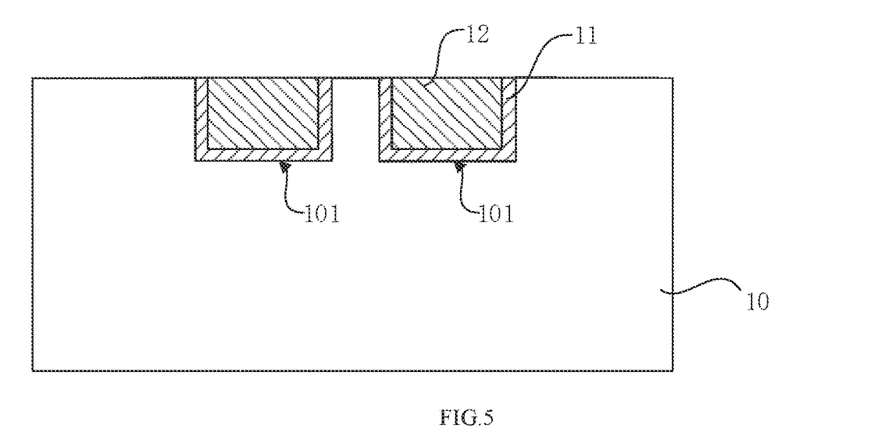

Thereafter, at step S3, as shown in FIG. 5, the N-type semiconductor layer 12 and the P-type semiconductor layer 11 are planarized, and the P-type semiconductor layer 11 and the N-type semiconductor layer 12 in the trench 101 are retained.

Specifically, Chemical Mechanical Polishing (CMP) can be used to planarize the N-type semiconductor layer 12 and the P-type semiconductor layer 11. After the planarization process is completed, an upper face of the N-type semiconductor layer 12 inside the trench 101 is flush with an upper surface of the semiconductor substrate 10 outside the trench 101.

Figure 6:
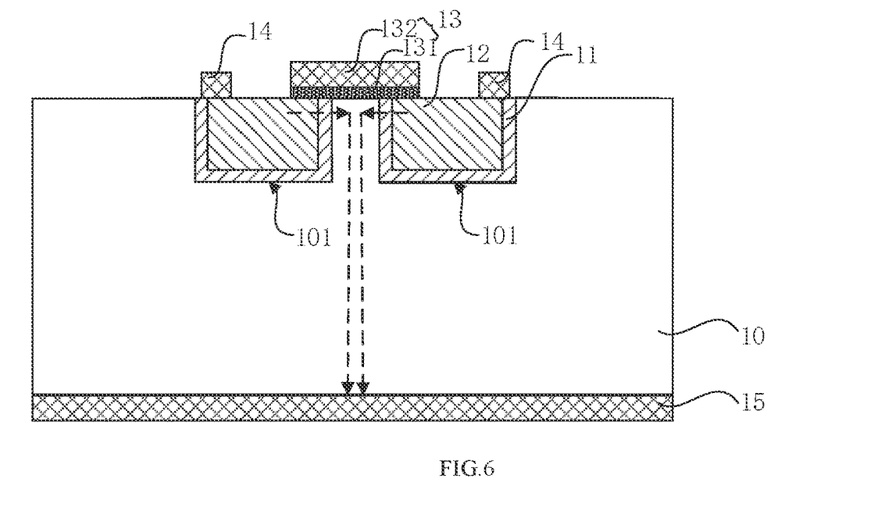

Then, at step S4, as shown in FIG. 6, a gate structure 13, a source electrode 14, and a drain electrode 15 are respectively formed. The gate structure 13 is located at a gate area of the front surface 10a of the semiconductor substrate. The source electrode 14 is located on two sides of the gate structure 13. The drain electrode 15 is located on the rear surface 10b of the semiconductor substrate.

In the step S4, if the shape of the trench 101 on the plane where the GaN-based semiconductor substrate 10 is located is strip-shaped, the gate structure 13, the source electrode 14 and the drain electrode 15 are correspondingly: a strip-shaped gate structure 13, a strip-shaped source electrode 14 and a strip-shaped drain electrode 15 parallel to an extending direction of the trench 101.

Referring to FIG. 6, in order to simplify the process, the gate structure 13 can extend from a P-type semiconductor layer 11 in one trench 101 to a P-type semiconductor layer 11 in the other trench 101.

In addition, in FIG. 6, the gate structure 13 includes a gate insulating layer 131 and a gate electrode 132 stacked on the gate insulating layer 131. For example, the vertical device is an insulated gate field effect transistor. In other alternatives, the gate structure 13 can only include the gate electrode 132. For example, the vertical device is a Schottky gate field effect transistor.

Compared with a vertical device with a trench gate structure 13, the above-described manufacturing method avoids etching the N-type semiconductor layer 12 and the P-type semiconductor layer 11 to make the gate structure 13, thereby avoiding that the control capability of the gate structure 13 deviates from a pre-designed control capability due to a difficulty in precise control over an etching depth. In this way, the performance of the vertical device can be precisely controlled through a manufacturing process.

Referring to FIG. 6, when the vertical device is of an enhancement type, a positive turn-on voltage is applied to the gate electrode 132, so that the P-type semiconductor layer 11 below the gate structure 13 is inverted into an N-type semiconductor layer, to form a channel. At this case, if there is a voltage difference between the source electrode 14 and the drain electrode 15, as shown by the dotted line, there is a conduction current between the source electrode 14 and the drain electrode 15. When the vertical device is of a depletion type, no voltage is applied to the gate electrode 132, so that the P-type semiconductor layer 11 below the gate structure 13 is inverted into an N-type semiconductor layer, to form a channel. At this case, if there is a voltage difference between the source electrode 14 and the drain electrode 15, as shown by the dotted line, there is a conduction current between the source electrode 14 and the drain electrode 15.

In addition, the semiconductor substrate 10 between two trenches 101 enables a shorter channel, which effectively alleviates the occurrence of a punch-through effect between the source electrode 14 and the drain electrode 15.

It will be understood that, compared with a single trench 101, double trenches 101 increase the number of channels, which can improve current capacity, reduce power consumption, and increase gain.

Figure 7:
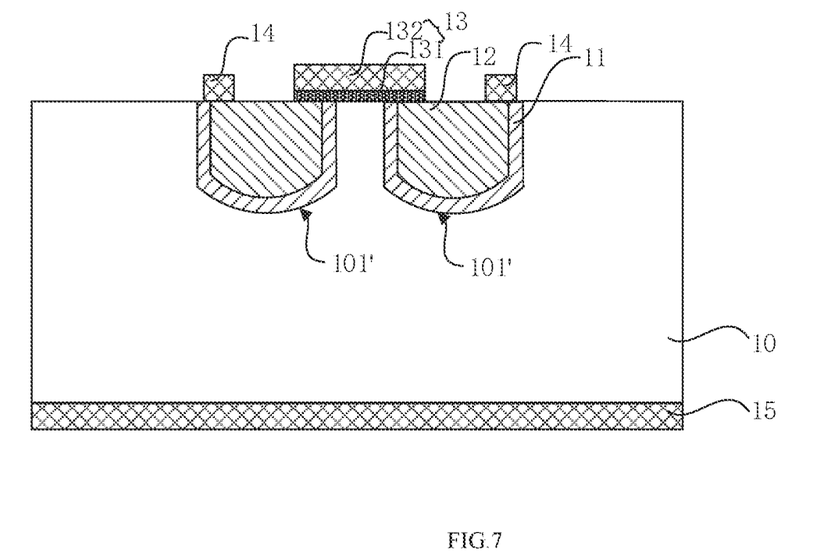
FIG. 7 is a schematic diagram illustrating an intermediate structure corresponding to a method for manufacturing a vertical device according to a second embodiment of the present invention.

FIG. 7 is a schematic diagram illustrating an intermediate structure corresponding to a method for manufacturing a vertical device according to a second embodiment of the present invention.

Referring to FIGS. 7 and 6, the method for manufacturing a vertical device according to the second embodiment is substantially the same as that according to the first embodiment, except that, in the step S1 of the first embodiment, a vertical section of the formed trench 101 is rectangular, but in the step S1 of the second embodiment, a vertical section of a formed trench 101' is U-shaped. The vertical section is vertical to the plane where the GaN-based semiconductor substrate 10 is located.

In other alternatives, the vertical section of the trench 101' can include a V shape or other shapes, which is not limited in the present invention.

Figure 8:
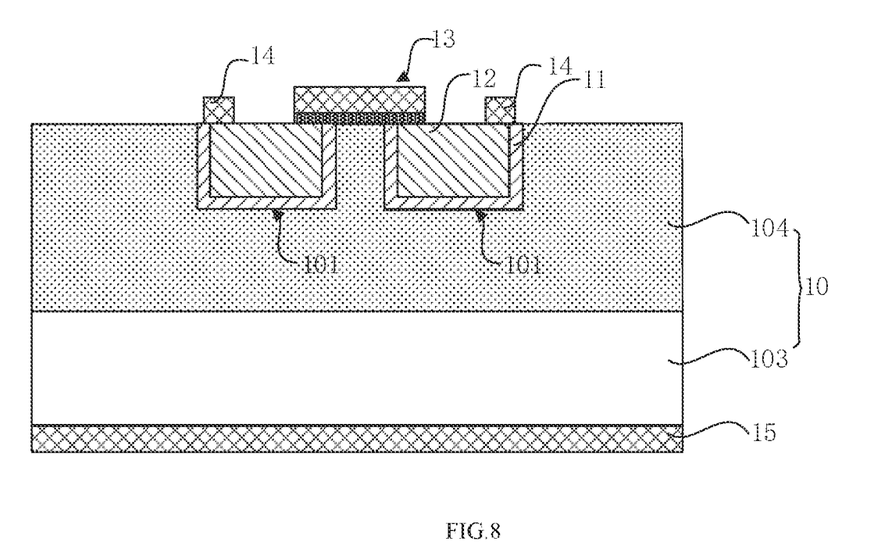
FIG. 8 is a schematic diagram illustrating an intermediate structure corresponding to a method for manufacturing a vertical device according to a third embodiment of the present invention.

FIG. 8 is a schematic diagram illustrating an intermediate structure corresponding to a method for manufacturing a vertical device according to a third embodiment of the present invention.

Referring to FIGS. 8 and 6, the method of manufacturing a vertical device according to the third embodiment is substantially the same as that according to the first and second embodiments, except that, in the step S1, the provided GaN-based semiconductor substrate 10 includes an N-type ion heavily doped layer 103 and an N-type ion lightly doped layer 104 on the N-type ion heavily doped layer 103, and the trench 101 is formed in the N-type ion lightly doped layer 104.

Figure 9:
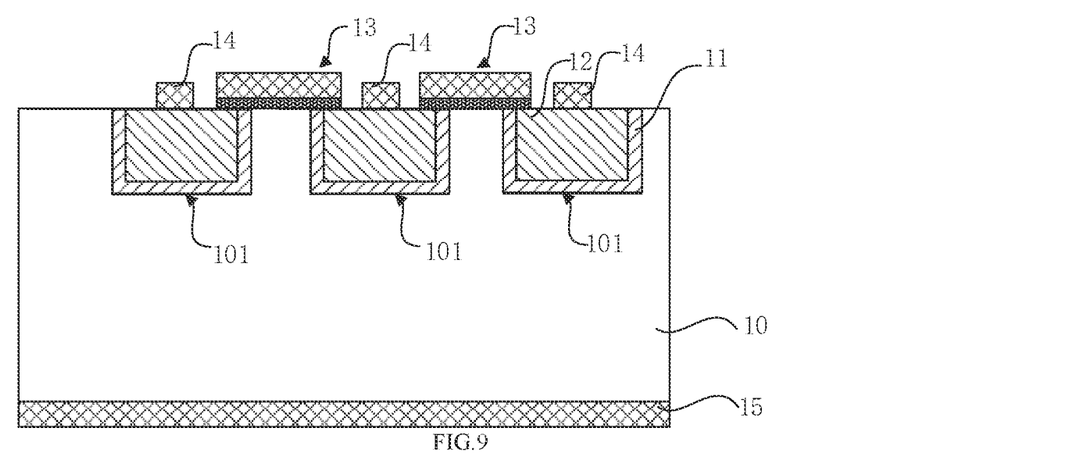
FIG. 9 is a schematic diagram illustrating an intermediate structure corresponding to a method for manufacturing a vertical device according to a fourth embodiment of the present invention.

FIG. 9 is a schematic diagram illustrating an intermediate structure corresponding to a method of manufacturing a vertical device according to a fourth embodiment of the present invention.

Referring to FIGS. 9 and 6 to 8, the method for manufacturing a vertical device according to the fourth embodiment is substantially the same as that according to the first to third embodiments, except that, in the step S1, the number of formed trenches 101 is three.

The number of gate structures 13 is two, and each gate structure 13 extends from a P-type semiconductor layer 11 in one trench 101 to a P-type semiconductor layer 11 in an adjacent trench 101. By increasing the number of trenches 101, the number of channels is further increased, and a plurality of vertical conductive structures are connected in parallel, which can improve current capacity, reduce power consumption, and increase gain.

In other alternatives, the number of trenches 101 can be N, where N>3. The number of gate structures 13 is N-1. Each gate structure 13 extends from a P-type semiconductor layer 11 in one trench 101 to a P-type semiconductor layer 11 in an adjacent trench 101. Advantages are: further improving current capacity, reducing power consumption, and increasing gain.

When the solution according to the fourth embodiment of the present invention is combined with the solution according to the third embodiment of the present invention, a plurality of trenches 101 are formed in the N-type ion lightly doped layer 104.

Figure 10:
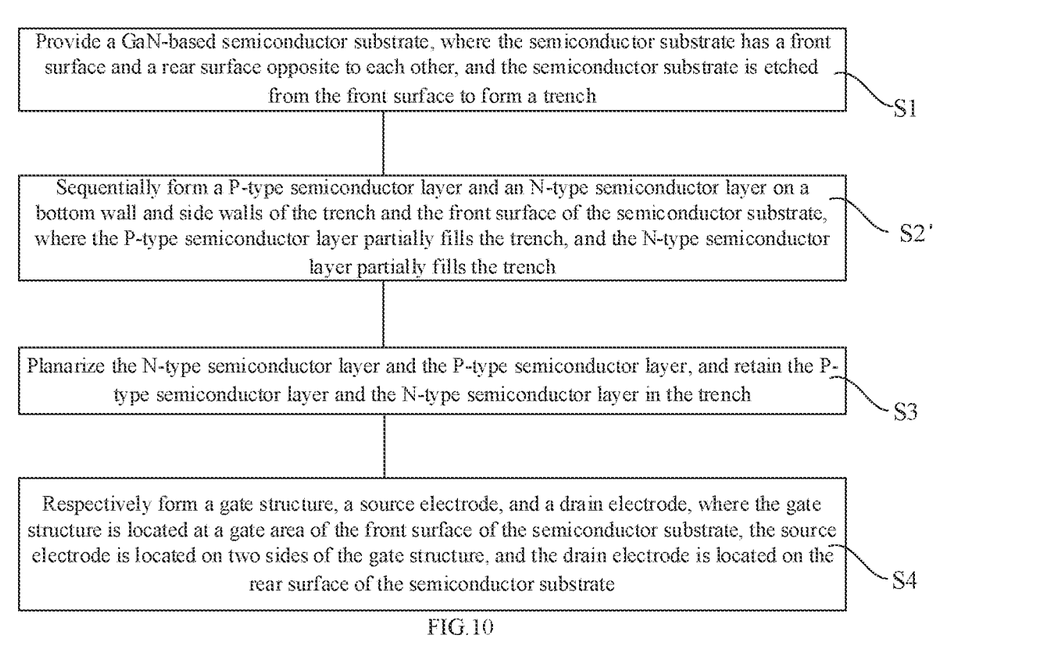
FIG. 10 is a flowchart illustrating a method for manufacturing a vertical device according to a fifth embodiment of the present invention.
Figure 11:
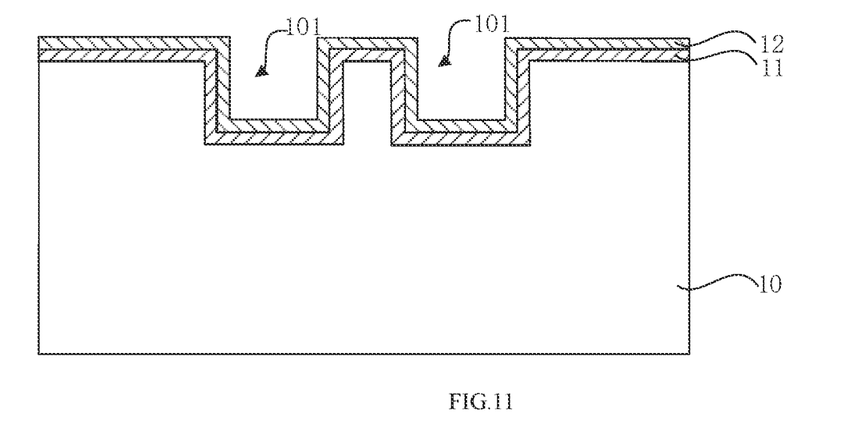
FIGS. 11 to 13 are schematic diagrams illustrating an intermediate structure corresponding to a process in FIG. 10.
Figure 12:
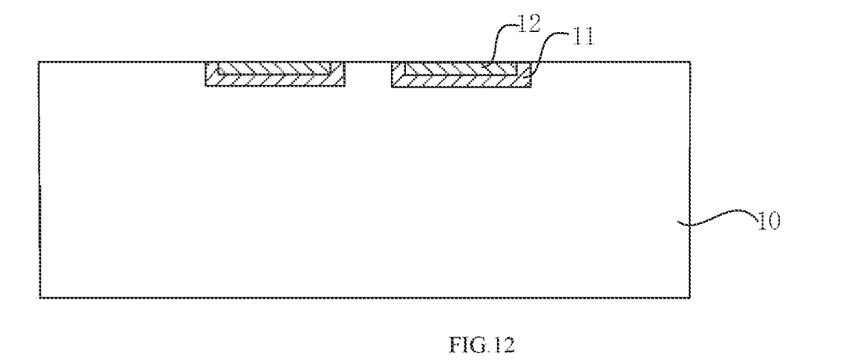
Figure 13:
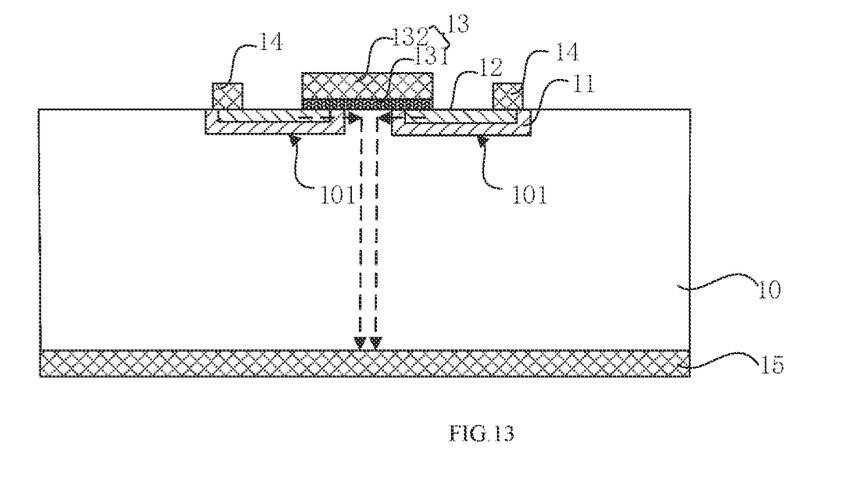

FIG. 10 is a flowchart illustrating a method for manufacturing a vertical device according to a fifth embodiment of the present invention. FIGS. 11 to 13 are schematic diagrams illustrating intermediate structures corresponding to a process in FIG. 10.

Referring to FIGS. 10 to 13 and 1 to 7, the method for manufacturing a vertical device according to the fifth embodiment is substantially the same as that according to the first and second embodiments, except that, in a step S2', the N-type semiconductor layer 12 partially fills the trench 101.

Referring to FIG. 11, the P-type semiconductor layer 11 and the N-type semiconductor layer 12 that partially fill the trench 101 can be implemented by forming a relative thin P-type semiconductor layer 11 and a relative thin N-type semiconductor layer 12.

In this way, referring to FIG. 12, in planarizing the N-type semiconductor layer 12 and the P-type semiconductor layer 11 of the step S3, a part of the semiconductor substrate 10 is removed to reduce thickness.

Referring to FIG. 13, when the vertical device is of an enhancement type, a positive turn-on voltage is applied to the gate electrode 132, so that the P-type semiconductor layer 11 below the gate structure 13 is inverted into an N-type semiconductor layer, to form a channel. At this case, if there is a voltage difference between the source electrode 14 and the drain electrode 15, as shown by the dotted line, there is a conduction current between the source electrode 14 and the drain electrode 15. When the vertical device is of a depletion type, no voltage is applied to the gate electrode 132, so that the P-type semiconductor layer 11 below the gate structure 13 is inverted into an N-type semiconductor layer, to form a channel. At this case, if there is a voltage difference between the source electrode 14 and the drain electrode 15, as shown by the dotted line, there is a conduction current between the source electrode 14 and the drain electrode 15.

Figure 14:
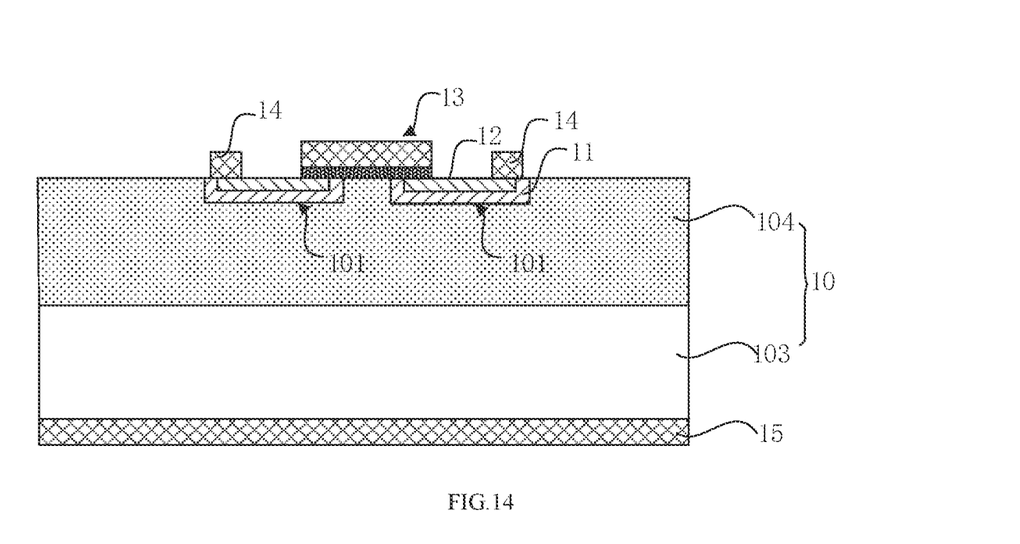
FIG. 14 is a schematic diagram illustrating an intermediate structure corresponding to a method for manufacturing a vertical device according to a sixth embodiment of the present invention.

FIG. 14 is a schematic diagram illustrating an intermediate structure corresponding to a method for manufacturing a vertical device according to a sixth embodiment of the present invention.

Referring to FIGS. 14 and 13, the method for manufacturing a vertical device according to the sixth embodiment is substantially the same as that according to the fifth embodiment, except that, in the step S1, the provided GaN-based semiconductor substrate 10 includes an N-type ion heavily doped layer 103 and an N-type ion lightly doped layer 104 on the N-type ion heavily doped layer 103, and the trench 101 is formed in the N-type ion lightly doped layer 104.

Figure 15:
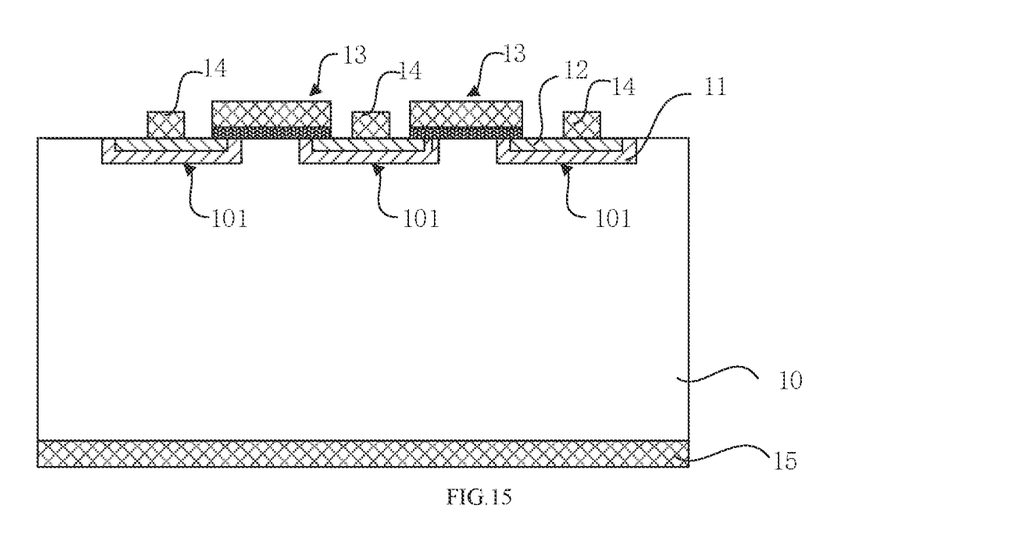
FIG. 15 is a schematic diagram illustrating an intermediate structure corresponding to a method for manufacturing a vertical device according to a seventh embodiment of the present invention.

FIG. 15 is a schematic diagram illustrating an intermediate structure corresponding to a method for manufacturing a vertical device according to a seventh embodiment of the present invention.

Referring to FIGS. 15, 13 and 14, the method fir manufacturing a vertical device according to the seventh embodiment is substantially the same as that according to the fifth and sixth embodiments, except that, in the step S1, the number of formed trenches 101 is three.

The number of gate structures 13 is two, and each gate structure 13 extends from a P-type semiconductor layer 11 in one trench 101 to a P-type semiconductor layer 11 in an adjacent trench 101. By increasing the number of trenches 101, the number of channels is further increased, and a plurality of vertical conductive structures are connected in parallel, which can improve current capacity, reduce power consumption, and increase gain.

In other alternatives, the number of trenches 101 can be N, where N>3. The number of gate structures 13 is N-1. Each gate structure 13 extends from a P-type semiconductor layer 11 in one trench 101 to a P-type semiconductor layer 11 in an adjacent trench 101. Advantages are: further improving current capacity, reducing power consumption, and increasing gain.

When the solution according to the seventh embodiment of the present invention is combined with the solution according to the sixth embodiment of the present invention, a plurality of trenches 101 are formed in the N-type ion lightly doped layer 104.

Although the present invention is disclosed as above, the present invention is not limited thereto. Any person skilled in the art can make various changes and modifications without departing from the spirit and scope of the present invention. Therefore, the protection scope of the present invention should be subject to the scope defined by the claims.

The invention claimed is:

1. A method of manufacturing a vertical device, comprising:
    providing a GaN-based semiconductor substrate, wherein the semiconductor substrate has a front surface and a rear surface opposite to the front surface, and the semiconductor substrate is etched from the front surface to form a trench;
    sequentially forming a P-type semiconductor layer and an N-type semiconductor layer on a bottom wall and side walls of the trench and the front surface of the semiconductor substrate, wherein the trench is partially filled with the P-type semiconductor layer, wherein doping ions in the P-type semiconductor layer and the N-type semiconductor layer are implemented by in-situ doping;

planarizing the N-type semiconductor layer and the P-type semiconductor layer, and retaining the P-type semiconductor layer and the N-type semiconductor layer in the trench; and respectively forming a gate structure, a source electrode, and a drain electrode, wherein the gate structure is located at a gate area of the front surface of the semiconductor substrate, the source electrode is located on two sides of the gate structure, and the drain electrode is located on the rear surface of the semiconductor substrate.

2. The method of manufacturing a vertical device according to claim 1, wherein in sequentially forming the P-type semiconductor layer and the N-type semiconductor layer on the bottom wall and the side walls of the trench and the front surface of the semiconductor substrate, the N-type semiconductor layer at least fully fills the trench.

3. The method of manufacturing a vertical device according to claim 1, wherein in sequentially forming the P-type semiconductor layer and the N-type semiconductor layer on the bottom wall and the side walls of the trench and the front surface of the semiconductor substrate, the N-type semiconductor layer partially fills the trench.

4. The method of manufacturing a vertical device according to claim 1, wherein a number of trenches is N, wherein N≥1, when N=1, a number of gate structures is 1; when N≥2, the number of gate structures is N−1.

5. The method of manufacturing a vertical device according to claim 4, when the number of trenches N≥2, the gate structure extends from a P-type semiconductor layer in one trench to a P-type semiconductor layer in the other trench.

6. The method of manufacturing a vertical device according to claim 1, wherein the N-type semiconductor layer and/or the P-type semiconductor layer comprises a GaN-based material.

7. The method of manufacturing a vertical device according to claim 1, wherein materials of at least two of the semiconductor substrate, the N-type semiconductor layer, or the P-type semiconductor layer are same or different.

8. The method of manufacturing a vertical device according to claim 1, wherein the N-type semiconductor layer and the P-type semiconductor layer are planarized by a chemical mechanical polishing method.

9. The method of manufacturing a vertical device according to claim 1, wherein the GaN-based semiconductor substrate is an N-type semiconductor substrate.

10. The method of manufacturing a vertical device according to claim 1, wherein the semiconductor substrate comprises an N-type ion heavily doped layer and an N-type ion lightly doped layer on the N-type ion heavily doped layer, and the trench is formed in the N-type ion lightly doped layer.

11. The method of manufacturing a vertical device according to claim 1, wherein the gate structure comprises a gate insulating layer, and a gate electrode provided on the gate insulating layer.

12. The method of manufacturing a vertical device according to claim 1, wherein at least part of the source electrode is located on the N-type semiconductor layer.

13. The method of manufacturing a vertical device according to claim 1, wherein a shape of the trench on a plane the semiconductor substrate located is rectangular, hexagonal, circular or strip-shaped.

14. The method of manufacturing a vertical device according to claim 13, wherein a vertical section of the trench is rectangular, U-shaped, or V-shape; wherein the vertical section is vertical to the plane the semiconductor substrate located.

15. The method of manufacturing a vertical device according to claim 13, when the shape of the trench on the plane the semiconductor substrate located is strip-shaped, the gate structure, the source electrode and the drain electrode are correspondingly: a strip-shaped gate structure, a strip-shaped source electrode and a strip-shaped drain electrode parallel to an extending direction of the trench.

16. The method of manufacturing a vertical device according to claim 1, wherein the gate structure comprises the gate electrode.

17. The method of manufacturing a vertical device according to claim 1, wherein the vertical device is a Schottky gate field effect transistor.

18. The method of manufacturing a vertical device according to claim 1, wherein the vertical device is an insulated gate field effect transistor.

* * * * *